United States Patent [19]
Song

[11] Patent Number: 6,090,692
[45] Date of Patent: Jul. 18, 2000

[54] FABRICATION METHOD FOR SEMICONDUCTOR MEMORY DEVICE

[75] Inventor: Du-Heon Song, Choongchungbook-Do, Rep. of Korea

[73] Assignee: LG Semicon Co., Ltd., Choongcheongbuk-Do, Rep. of Korea

[21] Appl. No.: 08/686,676

[22] Filed: Jul. 26, 1996

[30] Foreign Application Priority Data

Jul. 26, 1995 [KR] Rep. of Korea ............ 95-22239

[51] Int. Cl.⁷ ............ H01L 22/336; H01L 21/3205
[52] U.S. Cl. ............ 438/592; 438/303; 438/305; 438/530; 438/585
[58] Field of Search .................... 438/303, 530, 438/592, 585, 664, 305

[56] References Cited

U.S. PATENT DOCUMENTS

| | | | |
|---|---|---|---|
| Re. 32,613 | 2/1988 | Lepselter et al. ............ | 438/592 |
| 5,069,747 | 12/1991 | Cathey et al. ............ | 438/303 |
| 5,102,815 | 4/1992 | Sanchez ............ | 438/592 |
| 5,405,806 | 4/1995 | Pfiester . | |
| 5,565,383 | 10/1996 | Sakai ............ | 438/664 |
| 5,654,241 | 8/1997 | Kakumu . | |
| 5,668,024 | 9/1997 | Tsai et al. ............ | 438/664 |
| 5,677,213 | 10/1997 | Lee ............ | 438/530 |
| 5,702,972 | 12/1997 | Tsai et al. ............ | 438/664 |
| 5,763,312 | 6/1998 | Jeng et al. ............ | 438/303 |
| 5,770,508 | 6/1998 | Yeh et al. ............ | 438/305 |
| 5,780,350 | 7/1998 | Kapoor ............ | 438/303 |

*Primary Examiner*—Carl Whitehead, Jr.
*Assistant Examiner*—Toniae M. Thomas
*Attorney, Agent, or Firm*—Morgan, Lewis & Bockius LLP

[57] ABSTRACT

A fabrication method for a semiconductor memory device includes the steps of forming a gate pattern on a semiconductor substrate; forming first and second sidewall spacers at sides of the gate pattern; performing an ion=implantation of a high concentration impurity using the gate pattern and the first and second sidewall spacers as a mask, thereby forming an impurity diffusion region in the semiconductor substrate; performing an ion-implantation of a transition metal on the semiconductor substrate including the gate pattern and the first and second sidewall spacers, and then forming a polysilicide and a silicide by annealing; and removing the second sidewall spacers.

19 Claims, 4 Drawing Sheets

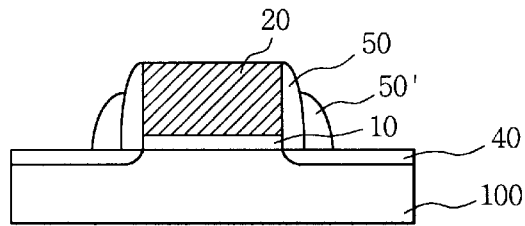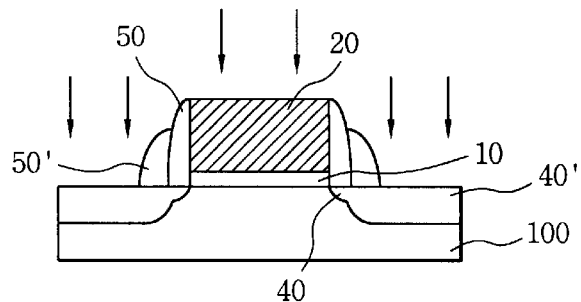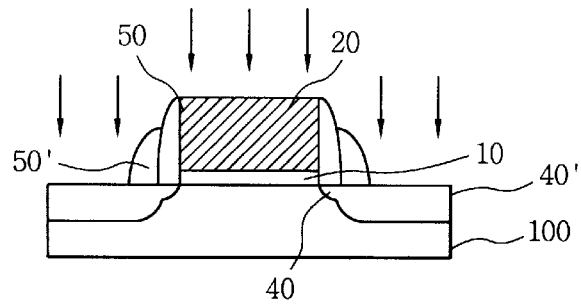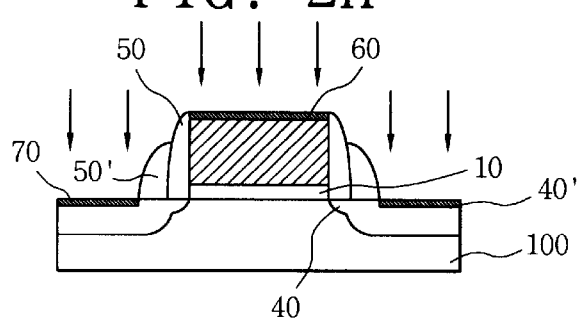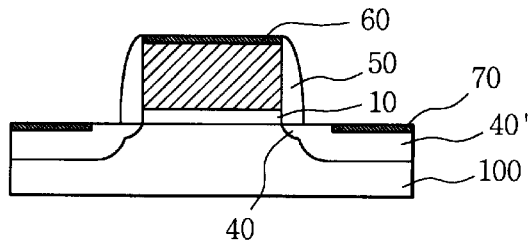

FABRICATION METHOD FOR SEMICONDUCTOR MEMORY DEVICE

FIELD OF THE INVENTION

The present invention relates to a fabrication method for a semiconductor memory device, and more particularly, to an improved fabrication method for a semiconductor memory device with a reduced contact resistance and a reduced leakage current.

DESCRIPTION OF THE RELATED ART

A conventional fabrication method for a semiconductor memory device will be described in detail with reference to the accompanying drawings.

First, as shown in FIG. 1A, a gate insulating film 1 and a gate metallization 2 formed of polysilicon are sequentially deposited on a semiconductor substrate 100 (that is, a silicon substrate).

Second, as shown in FIG. 1B, a photoresist pattern 3 is formed on a predetermined portion of the gate metallization 2, and a gate pattern is formed by etching the gate metallization 2 and the gate insulating film 1 by a photo etching process using the photoresist pattern 3 as a mask.

Third, as shown in FIG. 1C, a low concentration n-type or p-type dopant is ion-implanted into the substrate 100, using the photoresist pattern 3 as a mask. As a result, in predetermined portions of the substrate 100 as the left and right portions of the gate pattern, a low concentration n-type or p-type region 4 is formed serving as an impurity implantation region.

Next, as shown in FIG. 1D, the photoresist pattern 3 is removed, and an insulating film is deposited on the substrate 100 having the gate pattern thereon. Sidewall spacers 5 are formed at each side of the gate pattern by dry-etching the insulating film.

Then, as shown in FIG. 1E, a high concentration n-type or p-type dopant is ion-implanted, using the gate pattern and the sidewall spacers 5 as a mask. Consequently, a high concentration n-type or p-type junction region 4' serving as a dopant junction region is formed in predetermined portions of the substrate at the left and right sides of the sidewall spacers 5.

Then, as shown in FIG. 1F, a metal is ion-implanted into the substrate 100 on which the gate pattern and the sidewall spacers 5 are formed, and an annealing is carried out. As a result, as shown in FIG. 1G, a polysilicide 6 is formed in the gate metallization 2 in a predetermined portion where the metal is ion-implanted, and a silicide 7 is formed at the high concentration n-type or p-type junction regions 4' in a predetermined portion of where the metal is ion-implanted.

The above-described fabrication method has the following problems. When metal is ion-implanted, a portion of the implanted metal remains in each sidewall spacer 5 (shown as "a" in FIG. 1G). The remaining metal "a" changes the band structure of the insulating film, and generates a leakage current between the gate and the source/drain. Since the leakage current increases as the size of the sidewall spacer decreases due to the high integration of a semiconductor memory device, this reduces the reliability of a semiconductor memory device. In addition, since the remaining metal "a" in the sidewall spacers 5 undermines the insulation quality of the sidewall spacer, a trap generated by a hot carrier occurs easily.

SUMMARY OF THE INVENTION

Accordingly, the present invention is directed to a fabrication method for a semiconductor memory device that substantially obviates one or more of the problems due to limitations and disadvantages of the related art.

An object of the present invention is to provide an improved fabrication method for a semiconductor memory device with a reduced contact resistance of the source/drain regions.

Another object of the present invention is to provide an improved fabrication method for a semiconductor memory device with a reduced leakage current.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the fabrication method for a semiconductor memory device of the present invention includes the steps of forming a gate pattern on a substrate; forming first and second sidewall spacers on at least one side of the gate pattern; performing an ion-implantation of a high concentration impurity, thereby forming an impurity junction region in a predetermined portion of the substrate; forming a polysilicide on the gate pattern and a silicide on the impurity junction region; and removing the second sidewall spacers.

In another aspect, the fabrication method for a semiconductor memory device of the present invention includes the steps of forming a gate pattern on a semiconductor substrate, forming first and second sidewall spacers at each sidewall of the gate pattern, performing an ion-implantation of a high concentration dopant using as a mask the gate pattern and the first and second sidewall spacers for forming an impurity diffusion region in the substrate, performing an ion-implantation of a transition metal in the substrate on which the gate pattern and the sidewall spacers are formed and then forming a polysilicide and a silicide by annealing, and stripping the second sidewalls.

As a result of the above steps, a leakage current generated by the metal remaining in the sidewall spacers is greatly reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 2A through 2I are views showing a fabrication method for a semiconductor memory device according to the present invention.

DETAILED DESCRIPTION OF THE PREFERRED EMBODIMENTS

Reference will now be made in detail to the preferred embodiments of the present invention, examples of which are illustrated in the accompanying drawings.

FIGS. 2A through 2I are views showing a fabrication method for a semiconductor memory device according to the present invention. Referring to these drawings, the detailed steps of the fabrication method of the present invention will now be described.

Figure 1A:
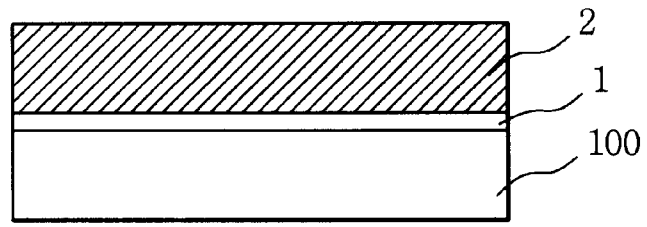
FIGS. 1A through 1G are views showing a conventional fabrication method for a semiconductor memory device.
Figure 1B:
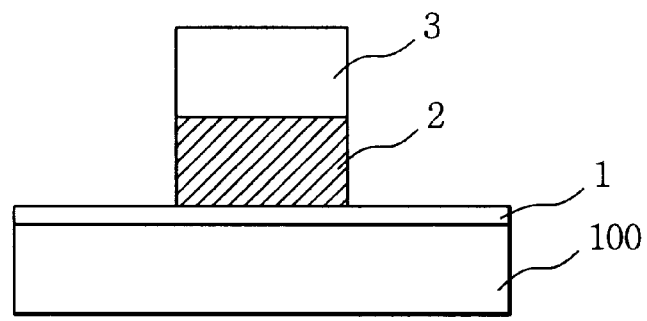
Figure 1C:
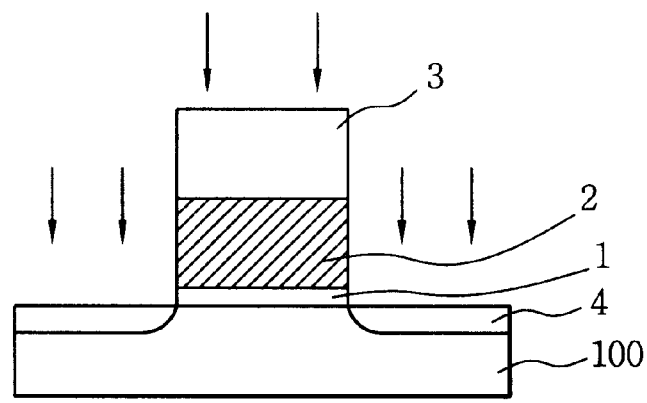
Figure 1D:
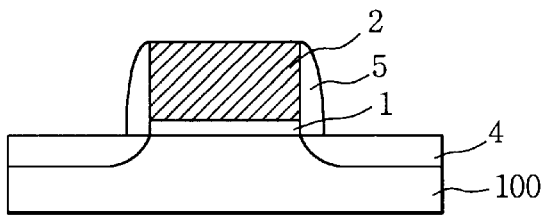
Figure 1E:
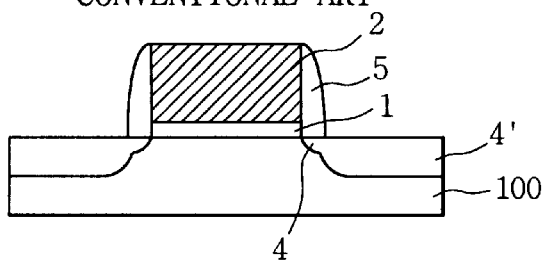
Figure 1F:
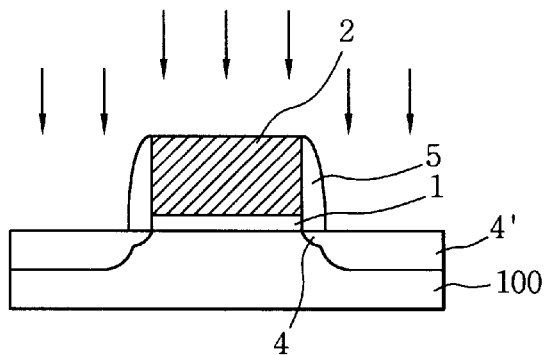
Figure 1G:
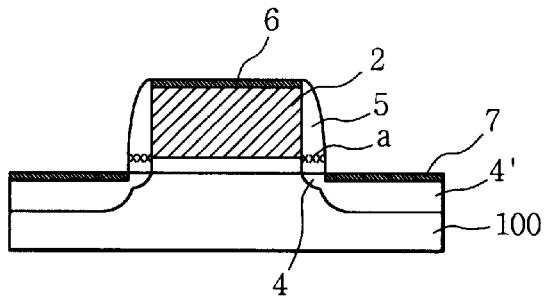
Figure 2A:
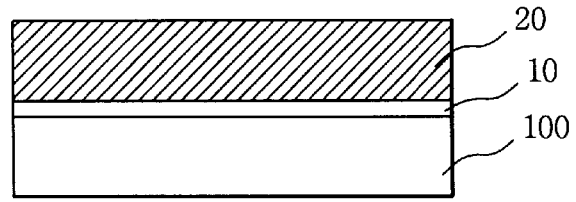
Figure 2B:
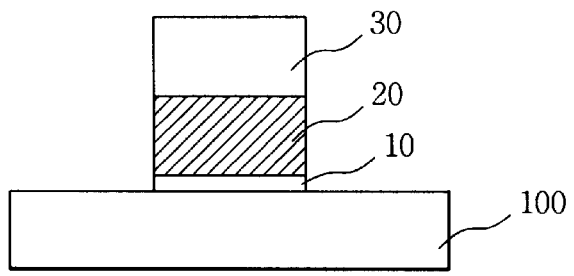

First, as shown in FIG. 2A and FIG. 2B, a gate insulating film 10 and a gate metallization 20 (for example, polysilicon) are sequentially deposited on a semiconductor substrate 100 (that is, a silicon substrate). Next, a photoresist pattern 30 is formed on a predetermined portion of the gate metallization 20. The gate metallization 20 and the gate insulating film 10 are then etched by a photo etching process to form a gate pattern using the photoresist pattern 30 as a mask.

Figure 2C:
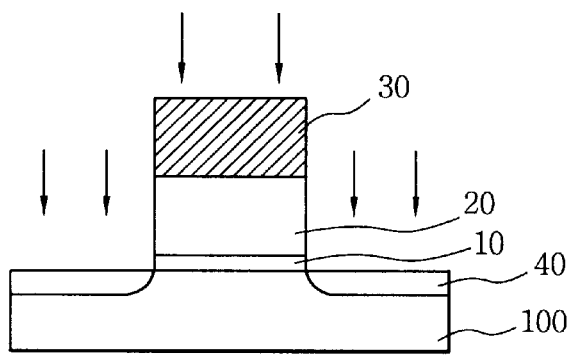

Next, as shown in FIG. 2C, a low concentration n-type or p-type dopant is ion-implanted into the substrate 100 using the photoresist pattern 30 as a mask. Consequently, a low concentration n-type or p-type region 40 serving as an impurity ion-implantation region is formed in a portion of the substrate at the left and right sides of the gate pattern.

Figure 2D:
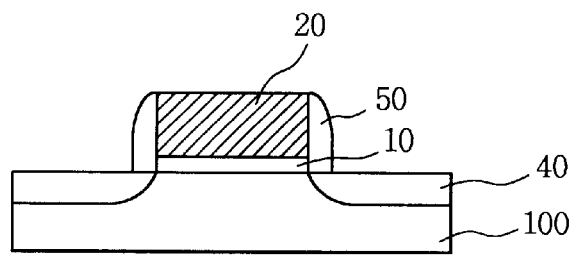

Then, as shown in FIG. 2D, the photoresist pattern 30 is removed, and a first insulating film (for example, an oxide film) is deposited on the substrate 100 having a gate pattern thereon. The first insulating film is anisotropically-etched, and as a result, first sidewall spacers 50 composed of the first insulating film are formed at each side of the gate pattern.

Next, as shown in FIG. 2E, a second insulating film (for example, a nitride film) is deposited on the resultant structure. The second insulating film has an excellent etching selectivity from the first sidewall spacers 50. Then, the second insulating film is etched (anisotropically-etched), thereby forming second sidewall spacers 50'.

Then, as shown in FIG. 2F, a high concentration n-type or p-type dopant is ion-implanted in the substrate 100, suing the gate pattern and the first and second sidewall spacers 50 and 50' as a mask. Consequently, high concentration n-type or p-type diffusion regions 40' serving as an impurity diffusion region are formed in a portion of the substrate, at the left and right sides of the second sidewall spacers 50'.

Subsequently, as shown in FIG. 2G, a transition metal, for example, cobalt (Co), molybdenum(Mo), tungsten(W) or titanium (Ti), is ion-implanted in the substrate 100 having the gate pattern and the first and second sidewall spacers 50 and 50' thereon. An annealing is carried out at a temperature of approximately 600 to 850° C. Here, the ion-implantation of the transition metal is performed under the following conditions: the substrate temperature being approximately 300 to 400° C., the concentration of the transition metal being approximately $1-7 \times 10^{16}$ cm$^{-2}$, and the ion-implantation energy being approximately 20–30 KeV. As a result, as shown in FIG. 2H, a polysilicide 60 is formed in the upper portion of the gate metallization 20 where the transition metal is ion-implanted, and silicides 70 are formed in the upper portions of the high concentration n-type or p-type junction regions 40' where the transition metal is ion-implanted.

Then, as shown in FIG. 2I, the second sidewall spacer 50' are removed by set-etching with a phosphoric acid ($H_3PO_4$) solution. This completes the process of the fabrication method of the present invention.

In the present invention, since most of the metal remaining in the sidewall spacers (after ion-implantation of the transition metal) exists in the second sidewall spacers 50', the removal of the second sidewall spacers 50' prevents the leakage current and the charge trapping due to a hot carrier.

Accordingly, the present invention provides an improved fabrication method for a semiconductor memory device which is capable of decreasing a contact resistance of the source/drain regions thereof by forming a silicide self-aligned by an ion-implantation of a transition metal. It is also capable of controlling a leakage current generated from a gate to the source/drain regions by using first and second sidewall spacers.

The present invention has the following advantages. First, the contact resistance at the source/drain regions can be reduced by the formation of a high quality silicide. In addition, no leakage current is generated between the gate and the source/drain regions since the metal remaining in the second sidewall spacers has been removed. Furthermore, the removal of the second sidewall spacers also improves the insulation of the resulting sidewall spacers, thus preventing the formation of a charge trap due to a hot carrier.

It will be apparent to those skilled in the art that various modifications and variations can be made in the fabrication method for a semiconductor memory device of the present invention without departing from the spirit or scope of the invention. Thus, it is intended that the present invention cover the modifications and variations of this invention provided they come within the scope of the appended claims and their equivalents.

What is claimed is:

1. A fabrication method for a semiconductor memory device, comprising the steps of:

forming a gate pattern on a semiconductor substrate;

forming first sidewall spacers and second sidewall spacers at sides of the gate pattern;

performing an ion-implantation of an impurity using the gate pattern and the first and second spacers as a mask, thereby forming an impurity diffusion region in the semiconductor substrate;

performing an ion-implantation of a transition metal on the semiconductor substrate including the gate pattern and the first and second sidewall spacers, and then forming a polysilicide and a silicide by annealing; and removing the second sidewall spacers.

2. The fabrication method of claim 1, wherein the step for forming the first and second sidewall spacers includes the steps of:

depositing a first insulating film on the semiconductor substrate including the gate pattern;

forming the first sidewall spacers at sides of the gate pattern by anisotropically-etching the first insulating film;

depositing a second insulating film on the substrate including the gate pattern and the first sidewall spacers; and forming the second sidewall spacers by anisotropically-etching the second insulating film.

3. The fabrication method of claim 1, wherein the first sidewall spacers have an etching selectivity from the second sidewall spacers.

4. The fabrication method of claim 1, wherein the first sidewall spacers include an oxide film.

5. The fabrication method of claim 1, wherein the second sidewall spacers include a nitride film.

6. The fabrication method of claim 1, wherein the transition metal is one of the group consisting of cobalt, molybdenum, tungsten and titanium.

7. The fabrication method of claim 1, wherein the step of ion-implantation of the transition metal is performed with a substrate temperature of approximately 300 to 400° C., a concentration of the transition metal of approximately $1-7 \times 10^{16}$ cm$^{-2}$ and an ion-implantation energy of approximately 20–30 KeV.

8. The fabrication method of claim 1, wherein the annealing is carried out in a temperature range of approximately 600 to 850° C.

9. The fabrication method of claim 1, wherein the second sidewall spacers are removed by wet-etching.

10. A fabrication method for a semiconductor memory device, comprising the steps of:

forming a gate pattern on a substrate;

forming first and second sidewall spacers on at least one side of the gate pattern;

performing a first ion-implantation of an impurity, thereby forming an impurity diffusion region in a portion of the substrate;

forming a polysilicide on the gate pattern and a silicide on the impurity diffusion region; and removing the second sidewall spacers.

11. The fabrication method of claim 10, further comprising the step of performing a second ion-implantation of the impurity to form an impurity ion-implantation region in the substrate, wherein the impurity ion-implantation region has a lower concentration of the impurity than the impurity diffusion region.

12. The fabrication method of claim 10, wherein the step of performing the first ion-implantation of the impurity is done by using the gate pattern and the first and second sidewall spacers as a mask.

13. The fabrication method of claim 10, wherein the step of forming the polysilicide and the silicide includes the steps of:

performing an ion-implantation of a transition metal on the substrate including the gate pattern;

annealing to form the polysilicide on the gate pattern and to form the silicide on an upper portion of the impurity diffusion region.

14. The fabrication method of claim 10, wherein the second sidewall spacers are removed by wet-etching.

15. The fabrication method of claim 14, wherein the wet-etching is performed using a phosphoric acid ($H_3PO_4$) solution.

16. The fabrication method of claim 10, wherein the step of forming the first and second sidewall spacers includes the steps of:

depositing a first insulating film on the semiconductor substrate including the gate pattern;

forming the first sidewall spacers at sides of the gate pattern by anisotropically-etching the first insulating film;

depositing a second insulating film on the substrate including the gate pattern and the first sidewall spacers; and forming the second sidewall spacers by anisotropically-etching the second insulating film.

17. The fabrication method of claim 10, wherein the first sidewall spacers have an etching selectivity from the second sidewall spacers.

18. The fabrication method of claim 13, wherein the transition metal is one of the group consisting of cobalt, molybdenum, tungsten and titanium.

19. The fabrication method of claim 13, wherein the step of ion-implantation of the transition metal is performed with a substrate temperature of approximately 300 to 400° C., a concentration of the transition metal of approximately $1-7 \times 10^{16}$ cm$^{-2}$ and an ion-implantation energy of approximately 20–30 KeV.

* * * * *